United States Patent
Yoshimoto

(10) Patent No.: US 10,177,081 B2
(45) Date of Patent: Jan. 8, 2019

(54) THYRISTOR AND THERMAL SWITCH DEVICE AND ASSEMBLY TECHNIQUES THEREFOR

(71) Applicant: Littelfuse, Inc., Chicago, IL (US)

(72) Inventor: Koichiro Yoshimoto, Irving, TX (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 15/406,065

(22) Filed: Jan. 13, 2017

(65) Prior Publication Data

US 2018/0204789 A1 Jul. 19, 2018

(51) Int. Cl.
| | | |
|---|---|---|
| *H01L 23/495* | (2006.01) | |
| *H01L 23/525* | (2006.01) | |
| *H01L 49/02* | (2006.01) | |
| *H01L 29/747* | (2006.01) | |

(52) U.S. Cl.
CPC .. *H01L 23/49575* (2013.01); *H01L 23/49562* (2013.01); *H01L 23/49582* (2013.01); *H01L 23/525* (2013.01); *H01L 28/26* (2013.01); *H01L 29/747* (2013.01)

(58) Field of Classification Search
CPC .......... H01L 28/26; H01L 29/747; H01L 2924/1301; H01L 23/49575; H01L 23/49562; H01L 23/49582; H01L 23/525
USPC .......... 257/119, 712; 337/298, 304
See application file for complete search history.

(56) References Cited

U.S. PATENT DOCUMENTS

| | | | | |
|---|---|---|---|---|
| 3,489,976 | A * | 1/1970 | Marcoux | H01H 61/013 335/107 |
| 3,708,720 | A * | 1/1973 | Whitney | H02H 5/042 257/108 |
| 5,150,271 | A | 9/1992 | Unterweger et al. | |
| 5,451,853 | A | 9/1995 | Itoh | |
| 6,331,763 | B1 * | 12/2001 | Thomas | H02H 9/042 320/136 |
| 2013/0285260 | A1 * | 10/2013 | Denison | H01L 25/07 257/777 |
| 2015/0043168 | A1 | 2/2015 | Douglas et al. | |
| 2016/0086753 | A1 | 3/2016 | Mochizuki et al. | |

OTHER PUBLICATIONS

International Search Report and Written Opinion, dated Apr. 16, 2018, for the International Application No. PCT/US2018/013455 (7 pages).

* cited by examiner

*Primary Examiner* — Jami V Miller

(57) ABSTRACT

A device may include a lead frame, where the lead frame includes a central portion, and a side pad, the side pad being laterally disposed with respect to the central portion. The device may further include a thyristor device, the thyristor device comprising a semiconductor die and further comprising a gate, wherein the thyristor device is disposed on a first side of the lead frame on the central portion. The device may also include a positive temperature coefficient (PTC) device electrically coupled to the gate of the thyristor device, wherein the PTC device is disposed on the side pad on the first side of the lead frame; and a thermal coupler having a first end connected to the thyristor device and a second end attached to the PTC device.

17 Claims, 3 Drawing Sheets

THYRISTOR AND THERMAL SWITCH DEVICE AND ASSEMBLY TECHNIQUES THEREFOR

BACKGROUND

Field

Embodiments relate to the field of surge protection devices, and more particularly to overvoltage protection devices and resettable fuses.

Discussion of Related Art

Thyristors are widely used in alternating current (AC) power control applications. As with other semiconductor switches, a thyristor generates heat when conducting current. Often a device or apparatus that includes a thyristor includes other components to measure or manage heat generation caused by the thyristor, including heat sinks, cooling fans, or temperature sensors to monitor the thyristor body temperature. Lacking temperature control, a thyristor may enter a thermal runaway state, leading to catastrophic failure. In cost-sensitive applications, large heat sinks or cooling fans are not an acceptable solution, forcing designers to specify operation of a thyristor well below its maximum operational rating to prevent heat-related failure.

With respect to these and other considerations, the present disclosure is provided.

SUMMARY

Exemplary embodiments are directed to improved protection devices. In one embodiment, a device may include a lead frame, where the lead frame includes a central portion, and a side pad, the side pad being laterally disposed with respect to the central portion. The device may further include a thyristor device, the thyristor device comprising a semiconductor die and further comprising a gate, wherein the thyristor device is disposed on a first side of the lead frame on the central portion. The device may also include a positive temperature coefficient (PTC) device electrically coupled to the gate of the thyristor device, wherein the PTC device is disposed on the side pad on the first side of the lead frame; and may include a thermal coupler having a first end connected to the thyristor device and a second end attached to the PTC device.

In another embodiment, a method may include providing a lead frame, the lead frame having a central portion and a side pad, where the side pad is laterally disposed with respect to the central portion. The method may further include affixing a thyristor device to a first side of the central portion of the lead frame, the thyristor device comprising a semiconductor die and further comprising a gate. The method may also include affixing a positive temperature coefficient (PTC) device to the side pad on the first side of the lead frame, and connecting a first end of a thermal coupler to the thyristor device and a second end of the thermal coupler to the PTC device, wherein the gate of the thyristor device is electrically connected to the PTC device.

DESCRIPTION OF EMBODIMENTS

Figure 1C:
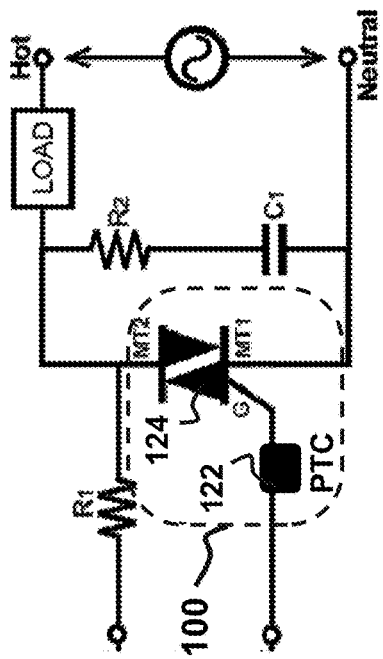
FIG. 1C provides a circuit depiction of one implementation of the device of FIG. 1A.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In various embodiments, a hybrid device is provided including a thyristor device such as a TRIAC (triode for alternating current), as well as a PTC device acting as a thermal switch. The apparatus may be arranged in a configuration that provides improved design, facilitating easier assembly as well as better integration into devices to be protected.

As used herein the term "thyristor device" may include a single thyristor, a silicon controlled rectifier (SCR) or a TRIAC device. As is known, a thyristor device is related to a silicon controlled rectifier, where an SCR is composed of a layered structure having an arrangement of N-type semiconductor regions or layers as well as P-type semiconductor layers or regions, in a four layer sequence of P-N-P-N, for example. In a thyristor, a gate is connected to an inner layer of the four-layer device. A TRIAC may be considered a type of thyristor where current conduction may take place in both directions, as opposed to a single thyristor that conducts current in just one direction. A TRIAC may be triggered by applying either a positive or a negative voltage to the gate. Once triggered, TRIACs continue to conduct, even if the gate current ceases, until the main current drops below a certain level called the holding current.

Figure 1B:
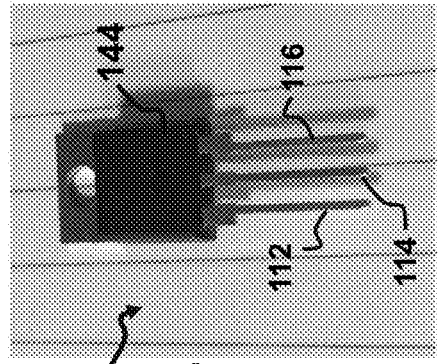
FIG. 1B presents a top plan view of a device in assembled form according to embodiments of the disclosure.
Figure 1A:
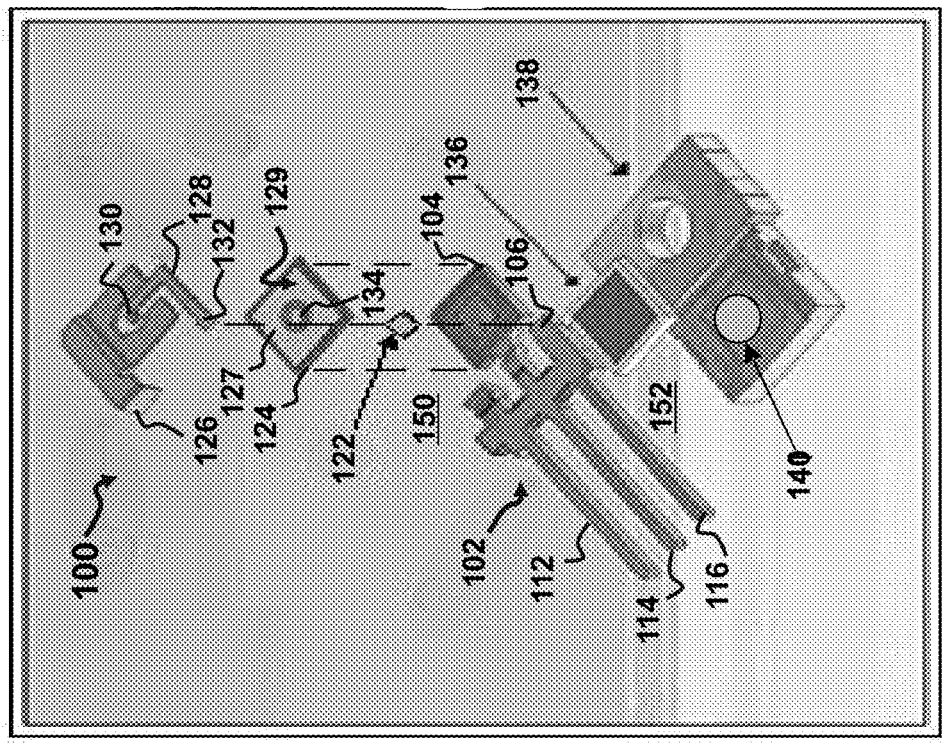
FIG. 1A presents an exploded perspective view of a device in accordance with the present embodiments.

The present embodiments provide improvements over known devices by integrating a positive temperature coefficient (PTC)-type component into a compact device to control operation of a thyristor device. FIG. 1A presents an exploded perspective view of a device 100 in accordance with the present embodiments, while FIG. 1B presents a top plan view of the device 100 in assembled form according to embodiments of the disclosure. Additionally, FIG. 1C provides a circuit depiction of one implementation of the device 100 of FIG. 1A. As shown in FIG. 1A, the device 100 includes a lead frame 102, where the lead frame 102 includes a central portion 104, and a side pad 106, where the side pad 106 is laterally disposed with respect to the central portion 104. The lead frame 102 may generally be composed of an electrically conductive material such as a metal, including a copper material, such as pure copper or copper alloys. The lead frame 102 may also include a first main terminal lead 112, a second main terminal lead 114, and a gate lead 116, as shown. The second main terminal lead 114 may be connected to the central portion 104. The device 100 may further include a thyristor device 124. The thyristor device 124 may be formed in a semiconductor die as a multiple layer structure where different layers have different doping polarity as in to known thyristor devices. The thyristor device 124 may be embodied as a TRIAC, where the thyristor device 124 includes a gate. As suggested in FIG. 1A, when assembled, the thyristor device 124 is disposed on a first side 150 of the lead frame (upper side of lead frame as shown in FIG. 1A) 102 on the central portion 104. As such, the second main terminal lead 114 may be electrically connected to the thyristor device 124 via a second main terminal electrode (not shown) of the thyristor device 124 on a lower surface opposite to an upper surface 129.

As shown in FIG. 1A, the device 100 includes a positive temperature coefficient (PTC) device 122, which device may be a polymer PTC device in various embodiments. Such a device may be capable of changing resistivity by a factor of 10,000 or so over a narrow range of temperatures, such as over 10 degrees C. or 20 degrees C. As discussed further below, when assembled, the PTC device 122 may be electrically coupled to the gate of the thyristor device 124, and in particular may be disposed on the side pad 106 on the first side 150 of the lead frame 102. As further depicted in FIG. 1A, the device 100 may include a thermal coupler 128, that when assembled, has a first end 130 connected to the thyristor device 124 and a second end 132 attached to the PTC device 122. The thermal coupler 128 may be a highly thermally conductive body, such as a copper arm, that provides a high thermal conduction path between the thyristor device 124 and the PTC device 122. As such, when the thyristor device 124 heats up during operation, the PTC device 122 may rapidly heat up in consequence, obtaining a temperature close to the temperature of the thyristor device 124.

As further shown in FIG. 1A the device 100 may include a main terminal contact clip 126, arranged to contact a first main terminal electrode 127 while not contacting the copper arm, that is, while not touching the thermal coupler 128. The main terminal contact clip 126 when assembled may provide an electrically conductive path between first main terminal lead 112 and the first main terminal (see MT1 of FIG. 1C) of the thyristor device 124. As such, during operation of the device 100, electrical current may be conducted between first main terminal lead 112, through the thyristor device 124 and to second main terminal lead 114. As detailed below, during operation, current flow between these two leads may be regulated by current supplied through gate lead 116.

When assembled, the thermal coupler 128 may also serve as an electrical connection between a gate electrode 134 disposed on the upper surface 129 of the thyristor device 124 and the PTC device 122. As such, during operation, the PTC device 122 is in electrical series between the gate lead 116 and the gate electrode 134. In this manner the PTC device 122 may serve as a current regulator for gate current supplied to the thyristor device 124. For example, under moderate current conditions of operation where current conducted by the thyristor device 124 is not excessive, the temperature of the thyristor device 124 may remain below a maximum junction temperature $T_{jmax}$, as defined in the art. In particular, if the junction temperature $T_j$ is increased above $T_{jmax}$, the leakage current may be high enough to trigger the thyristor's sensitive gate. The thyristor device will then have lost the ability to remain in the blocking state and current conduction will commence without the application of an external gate current.

The value of $T_{jmax}$ may be determined according to a specific TRIAC or thyristor device, as known in the art. For example, $T_{jmax}$ may be 110° C., 120° C., 130° C., or 140° C., or 150° C. in some examples. The embodiments are not limited in this context. The PTC device 122 may be designed to operate as a relatively low electrical resistance device when temperature is below $T_{jmax}$. Accordingly, adequate gate current may flow through an electrical circuit from gate lead 116 to gate electrode 134, providing for the targeted operation of the thyristor device 124. When temperature approaches $T_{jmax}$ or reaches $T_{jmax}$, the PTC device 122 may be designed with a trip temperature close to the $T_{jmax}$, wherein the PTC device 122 operates as a relatively high electrical resistance device. In one specific embodiment, a PTC device 122 may be designed with a trip temperature of 130° C., while a $T_{jmax}$ for a TRIAC used as thyristor device 124 is 150° C. In this manner, current may be starved from the gate of the thyristor device 124, causing the current conducted by the thyristor device 124 to be reduced, limiting further heating of the thyristor device 124. This limiting of current may be such that damage is prevented to the thyristor device 124 and surrounding components, where such damage may otherwise occur in a device lacking the PTC device 122 under runaway thermal conditions. As further shown in FIG. 1A the device 100 may include a heat sink 138, providing a thermal connection between the lead frame 102 and external heat sinks. The device 100 may also include ceramic substrate 136, connected by solder 140 to heat sink 138 and providing electrical isolation between lead frame 102 and the heat sink 138. The heat sink 138 is exposed to outside conditions and is connected to an outside heat sink (not shown), which heat sink may be an outer case of a final product.

Turning to FIG. 1B there is shown an assembled view of a variant of device 100, where the device 100 also includes a housing 144, not shown in FIG. 1A. The housing 144 may be a solid molded material as in known devices, that encases the other components described hereinabove. In operation, the device 100 may be conveniently coupled to any circuit or set of devices or components to be regulated, such as in AC applications. FIG. 1C provides a circuit representation of one implementation for device 100, where the device 100 includes a TRIAC as the thyristor device 124. As such, current regulation may take place in two opposite directions through the TRIAC with the aid of the PTC device 122.

Figure 2C:
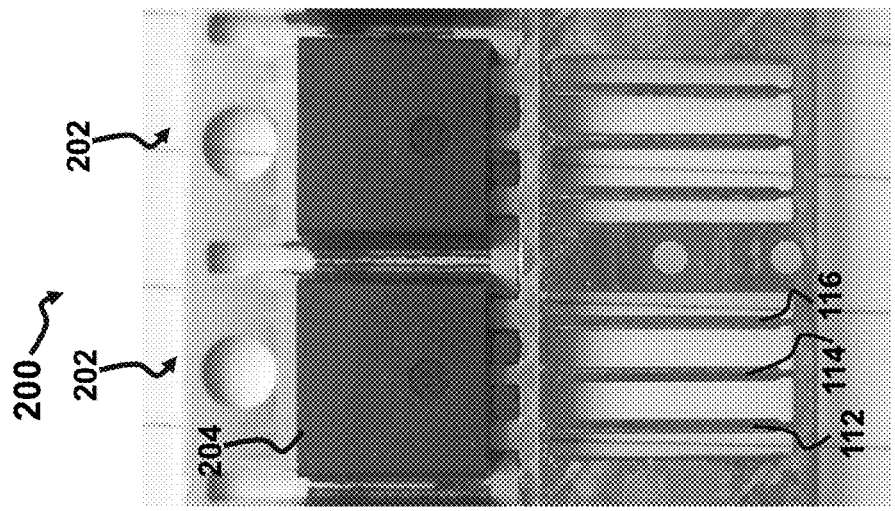
FIG. 2C presents a top plan view of an arrangement of devices at a third stage of assembly.
Figure 2B:
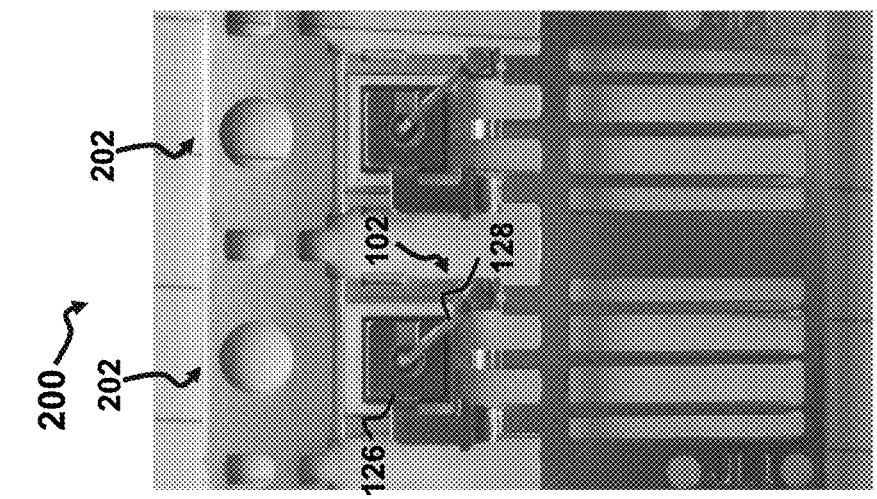
FIG. 2B presents a top plan view of an arrangement of devices at a second stage of assembly.
Figure 2A:
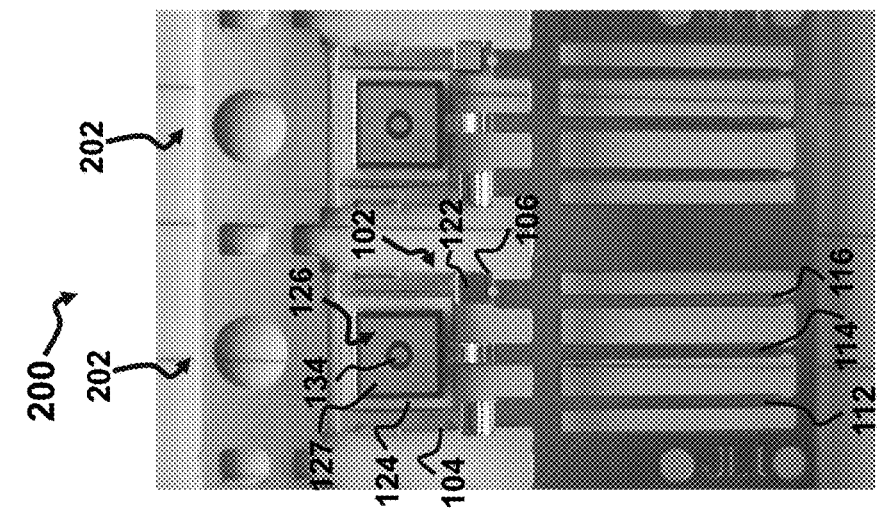
FIG. 2A presents a top plan view of an arrangement of devices at a first stage of assembly.

FIG. 2A presents a top plan view of an arrangement 200 of devices 202 at a stage of assembly that may be termed a first stage of assembly (not the beginning of assembly). In this example, the devices 202 may be substantially the same as device 100 described hereinabove. The arrangement 200 include a framework that houses multiple devices during assembly, where singulation of the devices (see FIG. 1B for example of a singulated device) may take place after assembly is complete. At the stage of assembly in FIG. 2A, a thyristor device 124 is affixed to the central portion 104 of a lead frame 102, for example, by soldering. The gate electrode 134 and first main terminal electrode 127 are disposed on the upper surface 129, facing outwardly (upwardly) and not in direct electrical contact with the central portion 104 that holds the thyristor device 124. Additionally, a second main terminal electrode (not shown) on a lower surface of the thyristor device 124 is in electrical contact with the central portion 104. In addition, a PTC device 122 is connected to the side pad 106, for example, by soldering.

FIG. 2B presents a top plan view of the arrangement 200 of devices at a second stage of assembly. At this stage of assembly, a thermal coupler 128 is in place, acting to electrically connect the PTC device 122 to the thyristor device 124, as well as to thermally couple the PTC device 122 to the thyristor device 124. The thermal coupler 128 may be soldered to the PTC device 122, and may be in the form of a metal clip that adheres to the gate electrode 134, and may be attached to the gate electrode by soldering or wire bonding. In addition, a first main terminal contact clip 126 is in place and may be soldered to the first main terminal lead 112. The first main terminal contact clip 126 is arranged to contact the first main terminal electrode 127, for example, using a solder connection, while not contacting the thermal coupler 128. In the embodiment shown, the first main terminal contact clip 126 has a C-shape, so as to provide extensive surface area to couple to the first main terminal electrode 127, while not contacting the gate electrode 134. Other shapes for the first main terminal electrode 127 are possible. Additionally, in the embodiment of FIG. 2B, the thermal coupler 128 may extend above the plane of the first main terminal contact clip 126, so as to extend over the first main terminal contact clip 126 while not touching the first main terminal contact clip 126, as shown. Other shapes for thermal coupler 128 are possible, for example, the right angle shape of the embodiment of FIG. 1A.

FIG. 2C presents a top plan view of the arrangement 200 of devices 202 at a third stage of assembly, where a given set of components to from a final device is encapsulated in a housing 204, such as an epoxy material. For example, a thyristor device together with corresponding PTC device are encapsulated in a given housing, while the gate lead 116, first main terminal lead 112, and second main terminal lead 114 extend outside of the housing 204. Subsequently, the arrangement 200 may be singulated to form a set of individual devices as shown in FIG. 1B.

In some embodiments, the PTC device 122 may be sized so as to fit on the side pad 106 in a manner that does not extend beyond the side pad 106. In some embodiments the PTC device 122 may have the shape of a rectangle or square in the plan view of FIG. 2A, where the size of the PTC device is 60 mil×60 mil or less. The embodiments are not limited in this context.

Figure 3:
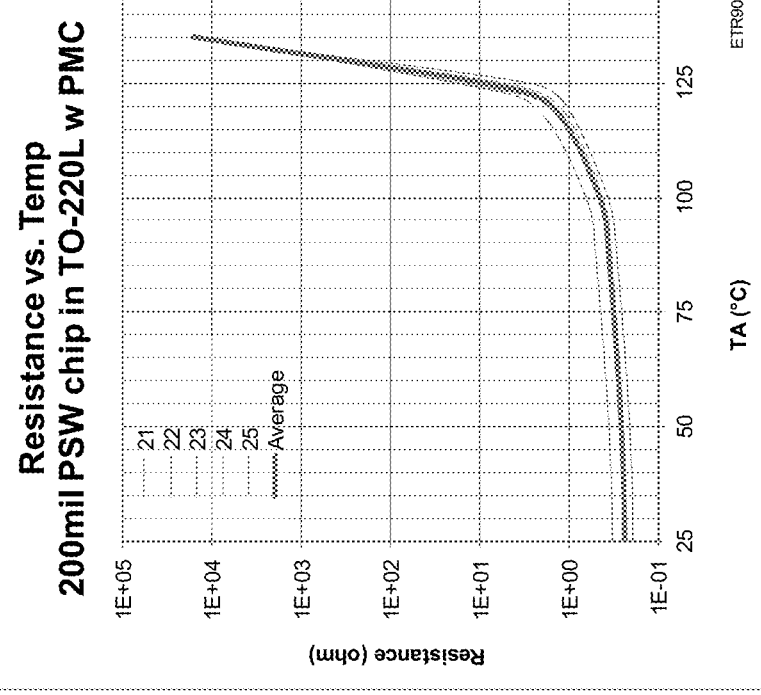
FIG. 3 depicts an exemplary graph showing characteristics of an exemplary PTC device.

In variants of the above embodiments, the electrical characteristics of the PTC device 122 may be tailored to the electrical characteristics of a thyristor device 124 to be protected. As an example, a given PTC device may be characterized by a trip temperature. The trip temperature corresponds to a temperature that separates a low temperature state (conduction state) where electrical resistance is relatively lower and increases relatively slowly with increased temperature, from a high temperature state (high impedance state) where electrical resistance becomes relatively much higher and increases relatively rapidly with increased temperature. FIG. 3 provides an exemplary graph showing resistance of an exemplary 200 mil square PTC test chip as a function of temperatures, where resistance is plotted on a logarithmic scale. In this example, a trip temperature may be designated at approximately 125° C. Below this temperature, the resistance is below a few Ohms and increases by just one order of magnitude over a 100 C range between 25 C and 125° C. Above the trip temperature the resistance increases by four orders of magnitude ($10^4$) over just 10° C. Accordingly, when current is being conducted through the PTC chip under initially "cold" conditions where temperature is less than 125° C., and the temperature of the PTC chip subsequently increases and exceeds 125° C. by just several degrees, the current passing through the PTC chip may be reduced by many orders of magnitude, other things being equal. These characteristics may be usefully harnessed by coupling the PTC chip of FIG. 3 to a thyristor device as described above, such as a TRIAC, where the TRIAC has a maximum junction temperature in the range of, for example, 125° C. to 145° C. In this manner, the temperature of the TRIAC, may be indirectly controlled by reduction of gate current supplied via the gate terminal and the PTC chip, when the TRIAC temperature exceeds 125° C. This limiting prevents a current/thermal runaway scenario, by limiting the duration and value of the maximum temperature experienced by the TRIAC to a targeted maximum level, such as $T_{jmax}$. As such, control of the operation of the TRIAC device is maintained. Additionally, the presence of the PTC chip allows the TRIAC device to operate close to or at $T_{jmax}$, an improvement over prior known TRIAC device operation where operating temperature may be limited to much lower temperatures to prevent thermal runaway and potential damage to devices.

Merely as an illustrative example, in the conduction state of a TRIAC, a gate driver may apply up to 12V when a gate current of 100 mA is needed. This condition leads to an impedance maximum of 120 Ohm. In a blocking state, a maximum of 20 V may be applied and the gate current is to be limited to less than 0.1 mA to maintain a TRIAC in an OFF state at a temperature of 125° C. In this circumstance the impedance called for is 200 kOhm or higher. Such change in resistance over more than three orders of magnitude may be readily achieved by a 60 mil×60 mil PTC device arranged according to the present embodiments. Notably, the impedance values shown for FIG. 3 using a 200 mil×200 mil PTC chip scale up by a factor of approximately 11 for a 60 mil×60 mil die.

Notably, to improve the design of a device such as the device 100, the thermal coupling between a PTC device 122 and a thyristor device 124 may be taken into account. For example, a $T_{jmax}$ or other design limit of a thyristor device may be 130° C. Under operation of the device structure of device 100, the thermal coupling between PTC device 122 and thyristor device 124 may such that when the thyristor device reaches 130 C, the temperature of the PTC device 122 as disposed on the side pad 106 may reach 110° C. Accordingly, the PTC device 122 may be arranged to have a trip temperature in the range of 110° C. so that a high impedance state is triggered when the PTC device 122 exceeds 110° C., corresponding to the condition when the thyristor device 124 temperature exceeds 130° C.

Figure 4:
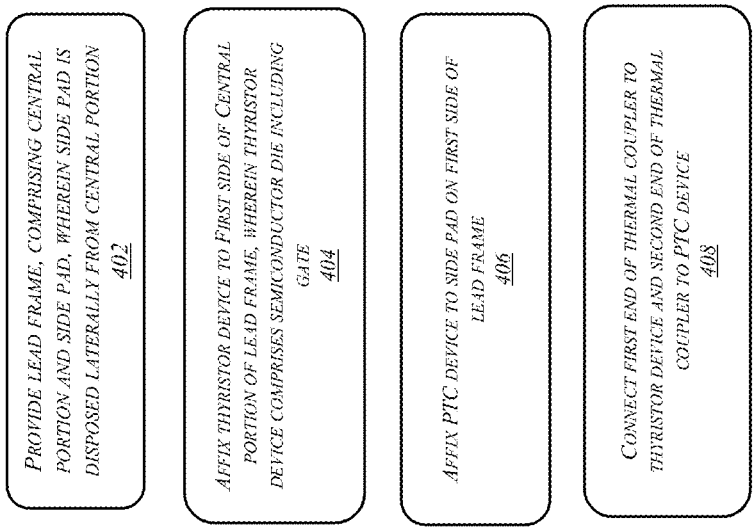
FIG. 4 shows a flow for assembly of an apparatus according to some embodiments of the disclosure.

FIG. 4 illustrates a process flow 400 according to additional embodiments of the disclosure. At block 402, a lead frame is provided, where the lead frame has a central portion and a side pad, where the side pad is laterally disposed with respect to the central portion. In various embodiments the lead frame may include three leads where one lead is connected to the central portion.

At block 404, a thyristor device, such as a TRIAC, is affixed to a first side of the central portion of the lead frame. The thyristor device may include a semiconductor die that has a gate. A gate may include a gate contact formed on an upper surface of the semiconductor die.

At block 406, a PTC device is affixed to the side pad on the first side of the lead frame. The PTC device may be soldered to the side pad, for example. At block 408, a thermal coupler is connected to the thyristor device on a first end and is connected to a PTC device on a second end. The thermal coupler may serve to electrically connect the thyristor device to the PTC device while also providing a high thermal conductance between the PTC device and thyristor device.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A hybrid device, comprising:
   a lead frame, the lead frame comprising:
      a central portion; and
      a side pad, the side pad being laterally disposed with respect to the central portion;
   a thyristor device, the thyristor device comprising a semiconductor die and further comprising a gate, wherein the thyristor device is disposed on a first side of the lead frame on the central portion;
   a positive temperature coefficient (PTC) device electrically coupled to the gate of the thyristor device, wherein the PTC device is disposed on the side pad on the first side of the lead frame, and is not disposed on the thyristor device; and
   a thermal coupler having a first end connected to the thyristor device and a second end attached to the PTC device.

2. The hybrid device of claim 1 wherein the lead frame comprises a copper material.

3. The hybrid device of claim 1, wherein the thermal coupler comprises a copper arm, the copper arm electrically connecting the gate to the PTC device.

4. The hybrid device of claim 3, wherein the thyristor device comprises an upper surface, the upper surface including a gate electrode and a first main terminal electrode, wherein the first main terminal electrode surrounds the gate electrode and is electrically isolated from the gate electrode.

5. The hybrid device of claim 4, further comprising a main terminal contact clip, arranged to contact the first main terminal electrode while not contacting the copper arm.

6. The hybrid device of claim 4, the lead frame further comprising:
   a first main terminal lead, electrically coupled to the first main terminal electrode of the thyristor device;
   a second main terminal lead, electrically coupled to a second main terminal electrode of the thyristor device on a lower surface opposite the upper surface; and
   a gate lead, electrically coupled to the PTC device.

7. The hybrid device of claim 6, wherein the copper arm connects to a first surface of the PTC device, and wherein the gate lead connects to a second surface of the PTC device, the second surface being opposite the first surface.

8. The hybrid device of claim 1, wherein the thyristor device comprises a TRIAC.

9. The hybrid device of claim 1, wherein the PTC device comprises a polymer PTC.

10. The hybrid device of claim 1, wherein the PTC device comprises a trip temperature, wherein the thyristor device comprises a maximum junction temperature, and wherein the maximum junction temperature exceeds the trip temperature by 20 degrees C. or less.

11. A method for forming a hybrid device, comprising:
    providing a lead frame, the lead frame comprising:
       a central portion; and
       a side pad, the side pad being laterally disposed with respect to the central portion;
    affixing a thyristor device to a first side of the central portion of the lead frame, the thyristor device comprising a semiconductor die and further comprising a gate;
    affixing a positive temperature coefficient (PTC) device to the side pad on the first side of the lead frame, wherein the PTC device is not disposed on the thyristor device; and
    connecting a first end of a thermal coupler to the thyristor device and a second end of the thermal coupler to the PTC device, wherein the gate of the thyristor device is electrically connected to the PTC device.

12. The method of claim 11, wherein the thermal coupler comprises a copper arm, the copper arm electrically connecting the gate to the PTC device.

13. The method of claim 12, further comprising:
    providing a gate electrode and a first main terminal electrode on an upper surface of the thyristor device, wherein the first main terminal electrode surrounds the gate electrode and is electrically isolated from the gate electrode; and
    affixing a main terminal contact clip to the first main terminal electrode while not contacting the copper arm or the gate electrode.

14. The method of claim 13, further comprising:
    connecting a first main terminal lead to the main terminal contact clip;
    coupling a second main terminal lead to a second main terminal contact of the thyristor device on a lower surface opposite the upper surface; and
    connecting a gate lead to the PTC device.

15. The method of claim 14, wherein the connecting the second end of the thermal coupler to the PTC device comprises connecting the thermal coupler to a first surface of the PTC device, and wherein the connecting the gate lead to the PTC device comprises connecting the gate lead connects to a second surface of the PTC device, the second surface being opposite the first surface.

16. The method of claim 11, wherein the thyristor device comprises a TRIAC.

17. The method of claim 11, wherein the PTC device comprises a polymer PTC.

* * * * *

UNITED STATES PATENT AND TRADEMARK OFFICE
CERTIFICATE OF CORRECTION

PATENT NO.        : 10,177,081 B2
APPLICATION NO.   : 15/406065
DATED             : January 8, 2019
INVENTOR(S)       : Koichiro Yoshimoto Page 1 of 1

It is certified that error appears in the above-identified patent and that said Letters Patent is hereby corrected as shown below:

On the Title Page

Item (73) Assignee: Please correct to read --Littelfuse, Inc.--

Signed and Sealed this
Twenty-sixth Day of November, 2019

Andrei Iancu
*Director of the United States Patent and Trademark Office*